United States Patent
Kawano et al.

(10) Patent No.: US 7,382,670 B2
(45) Date of Patent: Jun. 3, 2008

(54) SEMICONDUCTOR INTEGRATED CIRCUIT DEVICE

(75) Inventors: Tomohito Kawano, Yokohama (JP); Hidetoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/669,420

(22) Filed: Jan. 31, 2007

(65) Prior Publication Data

US 2007/0183233 A1 Aug. 9, 2007

(30) Foreign Application Priority Data

Feb. 1, 2006 (JP) ............... 2006-025043

(51) Int. Cl.
*G11C 7/00* (2006.01)
(52) U.S. Cl. .................. 365/201; 365/230.04
(58) Field of Classification Search ............... 365/201
See application file for complete search history.

(56) References Cited

U.S. PATENT DOCUMENTS

| | | | |
|---|---|---|---|
| 6,304,504 B1 * | 10/2001 | Chevallier et al. | 365/201 |
| 6,930,938 B2 | 8/2005 | Yasuda | |
| 7,009,897 B2 | 3/2006 | Sakemi | |
| 7,123,528 B2 * | 10/2006 | Jeong et al. | 365/201 |
| 2003/0235093 A1 * | 12/2003 | Kawano | 365/200 |
| 2006/0018167 A1 | 1/2006 | Jeong et al. | |

* cited by examiner

*Primary Examiner*—Son L Mai
(74) *Attorney, Agent, or Firm*—Oblon, Spivak, McClelland, Maier & Neustadt, P.C.

(57) ABSTRACT

There is disclosed a semiconductor integrated circuit device having first and second load circuits for write. At the time of an all bit-stress test, a high voltage for write is supplied from the first and second load circuits for write to the all bit lines. At the time of an even bit-stress test, the high voltage for write is supplied from the first load circuit for write to the even bit lines and a lower potential than the high voltage for write is supplied from the second load circuit for write to the odd bit lines. At the time of an odd bit-stress test, the lower potential is supplied from the first load circuit for write to the even bit lines and the high voltage for write is supplied from the second load circuit for write to the odd bit lines.

15 Claims, 11 Drawing Sheets

| | I/O deta input | | |
|---|---|---|---|
| | All stress | Even stress | Odd stress |
| IO<0>~<7> | ALL "0" | ALL "0" | ALL "1" |
| IO<8>~<15> | ALL "0" | ALL "1" | ALL "0" |
| MODE_St (EVEN_D/ODD_D) | L | L | L |
| WP10 ··· | H | H | L |
| WP18 ··· | H | L | H |

| | Mode stress | | |
|---|---|---|---|
| | All stress | Even stress | Odd stress |
| MODE_St | H | H | H |
| EVEN_D | H | H | L |
| ODD_D | H | L | H |
| IO<0>-<15> | Don't Care | Don't Care | Don't Care |
| WP10 ··· | H | H | L |
| WP18 ··· | H | L | H |

FIG. 11 Reference example

FIG. 12 Reference example

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-025043, filed Feb. 1, 2006, the entire contents of which are incorporated herein by reference.

BACKGROUND OF THE INVENTION

1. Field of the Invention

The present invention relates to a semiconductor integrated circuit device, and particularly to a semiconductor integrated circuit device improved in a method of applying stress to bit lines at a test time.

2. Description of the Related Art

A nonvolatile semiconductor memory, for example, a NOR-type flash memory is provided with a dedicated circuit for exclusive use in a bit line stress test in order to carry out the same test (all bits, even bits, odd bits) at a die sort test time. The dedicated circuit for the bit line stress test includes a load circuit for stress test, a transistor for applying stress, a decode circuit which selects the transistor for applying stress and a charging wiring.

When the NOR-type flash memory has a plurality of banks, the dedicated circuit for the bit line stress test needs the load circuit in every bank and when the NOR-type flash memory has a plurality of blocks, it needs the transistor for applying stress and the decode circuit which selects the transistor, in every block.

The NOR-type flash memory is improved in downsizing and enlarging capacity. Building the dedicated circuit for the bit line stress test into a memory chip disturbs the downsizing and the enlargement of capacity.

BRIEF SUMMARY OF THE INVENTION

A semiconductor integrated circuit device according to a first aspect of the present invention comprises: a cell array in which a plurality of memory cells are arranged in a matrix shape; a plurality of bit lines connected to the memory cells; a plurality of column select transistors connected to the bit lines; a column decoder which selects the column select transistor; a first load circuit for write which is connected to even bit lines of the bit lines and supplies potential according to write data to the even bit lines at the time of writing data; and a second load circuit for write which is connected to odd bit lines in the bit lines and supplies potential according to write data to the odd bit lines at the time of writing data, wherein when a bit line stress test is carried out, in the case of an all bit-stress test, the column decoder selects all the column select transistors and supplies a high voltage for write from the first load circuit for write and the second load circuit for write to the even bit lines and the odd bit lines, in the case of an even bit-stress test, the column decoder selects all the column select transistors, supplies the high voltage for write from the first load circuit for write to the even bit lines, and supplies a lower potential than the above high voltage from the second load circuit for write to the odd bit lines, and in the case of an odd bit-stress test, the column decoder selects all the column select transistors, supplies the lower potential than the above high voltage from the first load circuit for write to the even bit lines, and supplies the high voltage for write from the second load circuit to the odd bit lines.

DETAILED DESCRIPTION OF THE INVENTION

Figure 1:
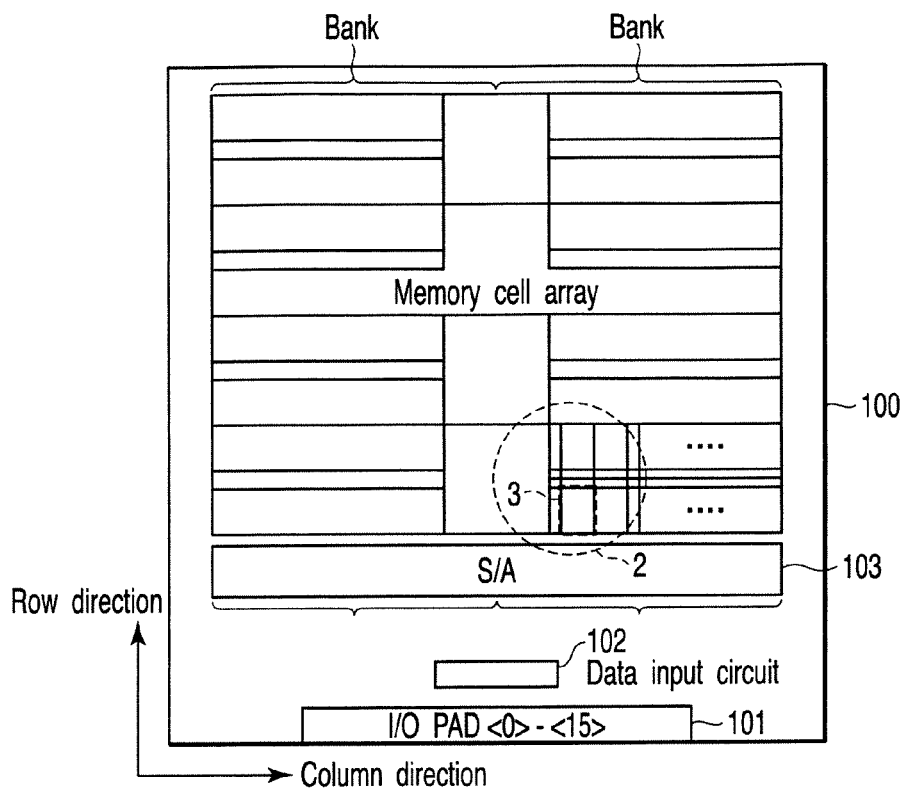
FIG. 1 is a plan view showing a layout example of a semiconductor integrated circuit device according to an embodiment of the invention.

Hereinafter, an embodiment of the invention will be described referring to the drawings. In the description, the same reference numerals are attached to the same portions in all the drawings.

FIG. 1 is a plan view showing a layout example of a semiconductor integrated circuit device according to the embodiment of the invention. FIG. 1 shows a nonvolatile semiconductor memory, for example, a NOR-type flash memory as an example of the semiconductor integrated circuit device, but the invention is not applied only to the NOR-type flash memory. The invention may be also applied to a nonvolatile semiconductor memory other than the NOR-type flash memory.

As shown in FIG. 1, the NOR-type flash memory according to the embodiment has an input/output pad portion (I/O PAD<0>--<15>) 101, a data input circuit portion 102, a sense amplifier portion (S/A) 103, and a memory cell array 200. These circuit blocks are formed into a semiconductor chip, for example, a silicon chip 100.

Input/output pads are arranged in the input/output pad portion 101. The input/output pad is an electrical connecting point between the chip 100 and the outside. Write data into the NOR-type flash memory is input to the input/output pad portion 101 and read data from the NOR-type flash memory is output from the input/output pad portion 101. There are sixteen input/output pads in the embodiment. The input/output pads are electrically connected to the data input circuits arranged in the data input circuit portion 102.

The data input circuit is provided, for example, for every input/output pad. Since the embodiment has sixteen input/output pads, sixteen data input circuits are provided. The data input circuits are electrically connected to the sense amplifiers arranged in the sense amplifier portion 103.

The sense amplifier amplifies the write data transmitted from the data input circuit and the read data transmitted from the memory cell, and temporality holds the amplified data. The sense amplifier is provided for every data input circuit, for example, when the NOR-type flash memory is formed by a single bank (one bank). For example, when the NOR-type flash memory has sixteen data input circuits in the structure of one bank, there are provided sixteen sense amplifiers. The NOR-type flash memory according to the embodiment is formed in a multi-bank structure. That is, it is formed by two banks. The sense amplifier portion 103 includes thirty-two sense amplifiers in total; sixteen sense amplifiers belonging to the first bank and sixteen sense amplifiers belonging to the second bank. The sixteen sense amplifiers belonging to the first bank are connected to the load circuits for write belonging to the first bank and the sixteen sense amplifiers belonging to the second bank are connected to the load circuits for write belonging to the second bank.

Figure 2:
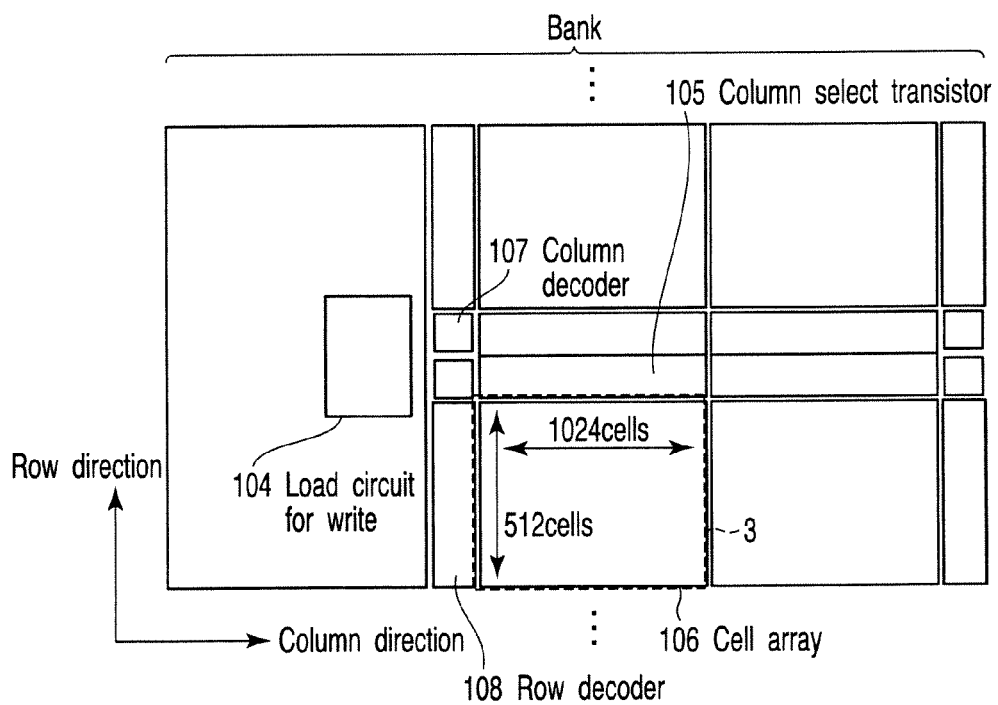
FIG. 2 is an enlarged view showing the inside of a dotted-line circle 2 of FIG. 1 in an enlarged way.

FIG. 2 is an enlarged view showing the inside of a dotted-line circle 2 of FIG. 1 in an enlarged way. The dotted-line circle 2 shows basic elements of the memory cell array 200.

As shown in FIG. 2, the basic elements of the memory cell array 200 include a load circuit portion for write 104, a column select transistor portion 105, a cell array 106, a column decoder 107, and a row decoder 108.

Load circuits for write are arranged in the load circuit portion for write 104. The load circuit for write is provided, for example, for every sense amplifier. Since there are sixteen sense amplifiers in one bank, sixteen load circuits for write are provided in the basic element shown in FIG. 2. The load circuits for write are electrically connected to data lines. The data lines are electrically connected to bit lines through the column select transistors arranged in the column select transistor portion 105. The bit lines are arranged on the cell array 106 and electrically connected to a plurality of memory cells arranged on the cell array 106 in a matrix shape. The memory cells arranged on the cell array 106 in a matrix shape form a unit called a "block". The cell array 106 of the embodiment includes 524,288 memory cells in total: 1,024 cells in the column direction×512 cells in the row direction. In the embodiment, the column direction is the direction in which the bit lines are aligned and the row direction is the direction in which the word lines are aligned. The column select transistor portion 105, the column decoder portion 107, and the row decoder portion 108 are provided for every block. Some blocks share the load circuit portion for write 104. The one bank is configured by repeating the basic element shown in FIG. 2 the predetermined number of times, for example, in the row direction within the chip 100.

Figure 3:
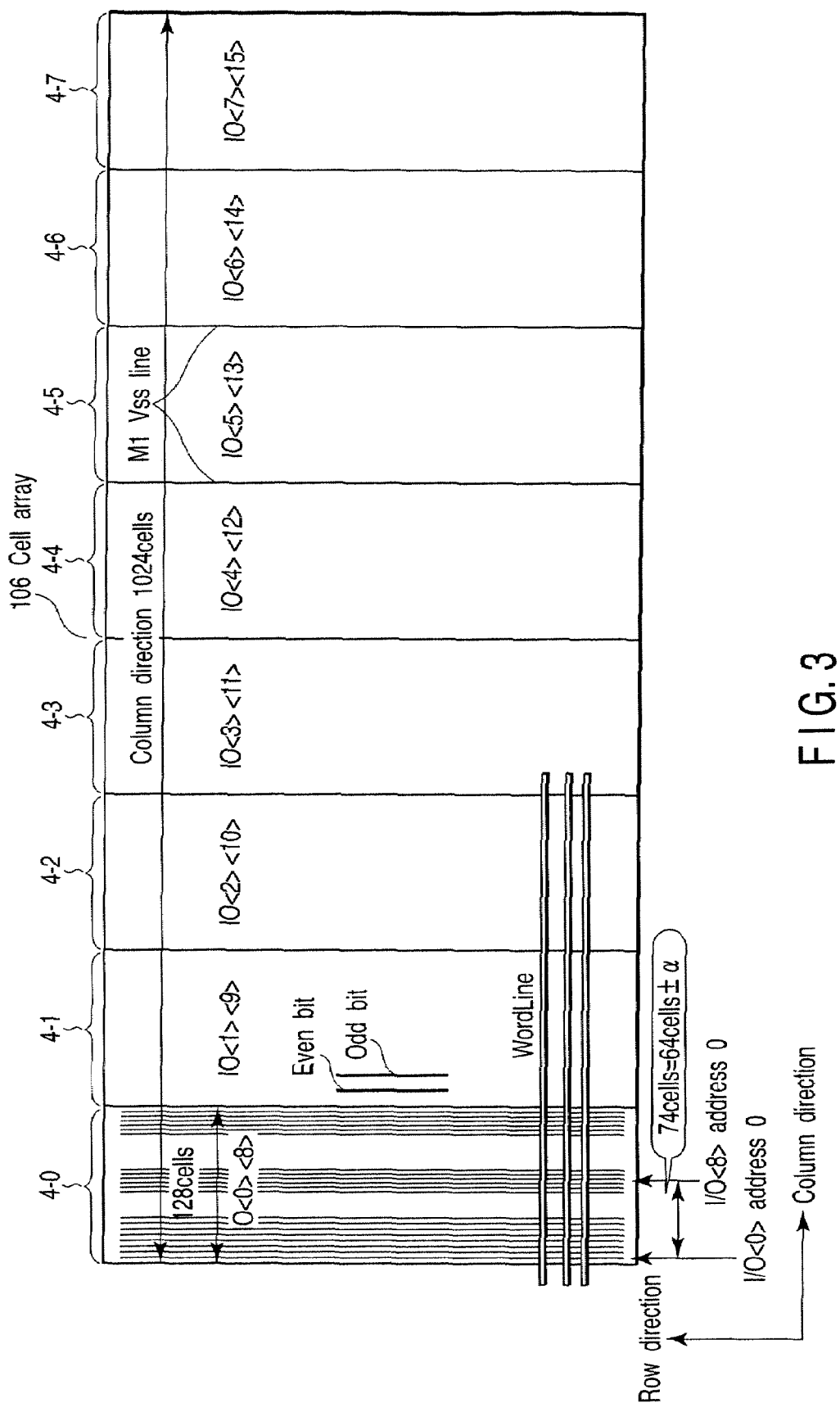
FIG. 3 is an enlarged view showing the inside of a dotted-line frame 3 of FIG. 2 in an enlarged way.

FIG. 3 is an enlarged view showing the inside of a dotted-line frame 3 of FIG. 2 in an enlarged way.

As shown in FIG. 3, the cell array 106 repeats a basic pattern 4. One basic pattern 4 includes 128 cells in the column direction. The cell array 106 of the embodiment is formed by repeating the basic pattern 4 eight times in the column direction. In the embodiment, of the sixteen data input circuits and load circuits for write (I/O<0>-<15>), a pair of them is assigned to one basic pattern 4. An example of specific assignment is shown as follows.

Basic Pattern 4-0: I/O<0>, <8>
Basic Pattern 4-1: I/O<1>, <9>
Basic Pattern 4-2: I/O<2>, <10>
Basic Pattern 4-3: I/O<3>, <11>
Basic Pattern 4-4: I/O<4>, <12>
Basic Pattern 4-5: I/O<5>, <13>
Basic Pattern 4-6: I/O<6>, <14>
Basic Pattern 4-7: I/O<7>, <15>

The number of 64 bits is assigned to each pair of the data input circuit and the load circuit for write (I/O<0>-<15>). One pair of the data input circuit and the load circuit for write (I/O<0>-<15>) is electrically connected to the column select transistor portion 105 through one data line. At the time of normal operation, the column select transistor portion 105 connects one data line to one of the 64 bit lines. At the time of a bit line stress test, as described below, the column select transistor portion 105 of the embodiment connects one data line to all the 64 bit lines.

The column select transistor portion 105 includes the column select transistors. The column select transistor is selected by the column decoder 107. At the normal operation, the column decoder 107 decodes the column address CAD and selects one of a plurality of column select transistors. In the embodiment, because of 1/64 select, the column decoder 107 decodes six column addresses CAD 0 to CAD 5 and selects one of the sixty-four column select transistors per one data line.

Figure 4:
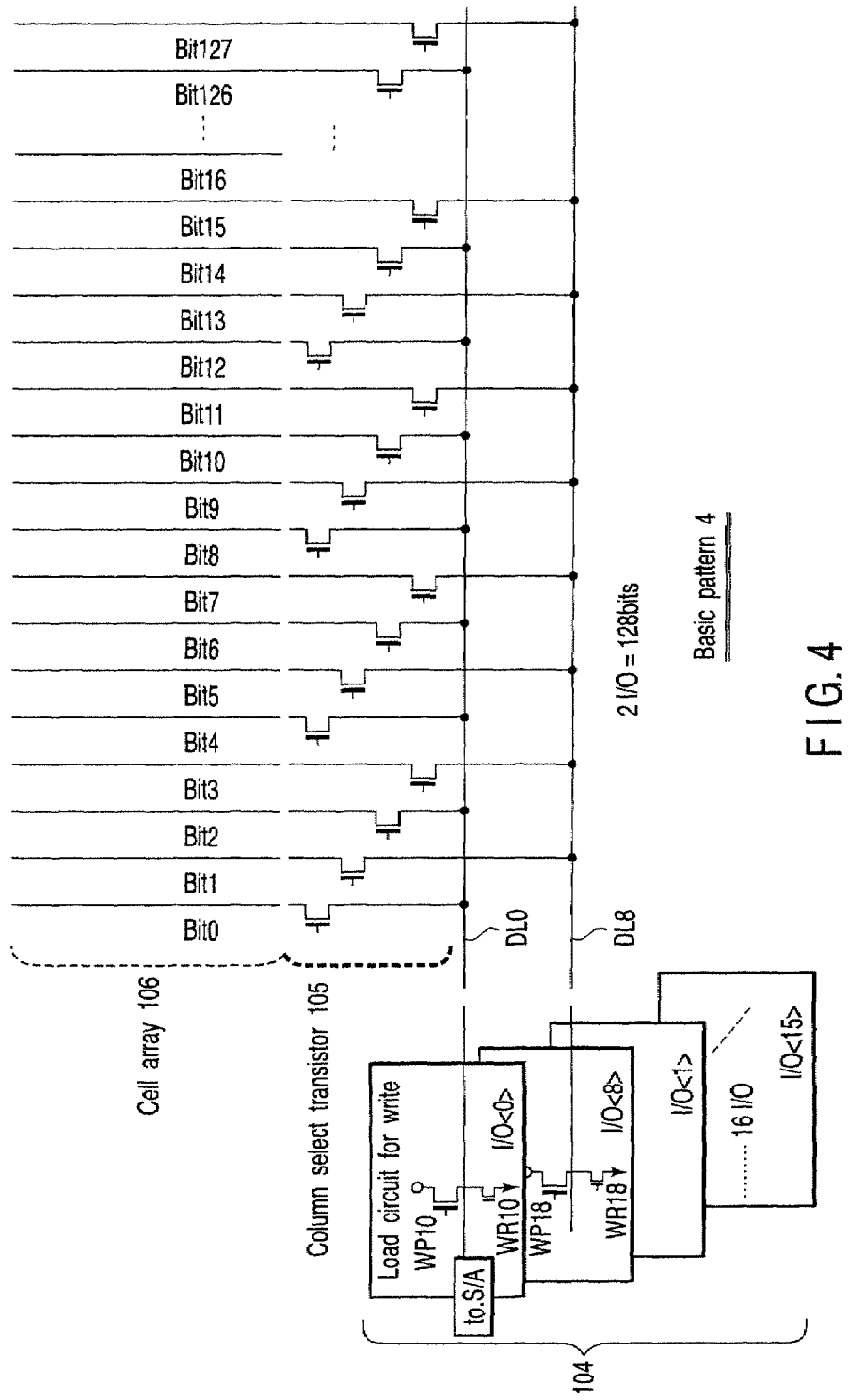
FIG. 4 is a circuitry showing an example of an equivalent circuit of a basic pattern shown in FIG. 3.

FIG. 4 is a circuitry showing an equivalent circuit of the basic pattern 4 shown in FIG. 3. FIG. 4 shows a basic pattern 4-0 shown in FIG. 3.

As shown in FIG. 4, the load circuit for write I/O<0> is electrically connected to the data line DL 0 and the load circuit for write I/O<8> is electrically connected to the data line DL 8. In the embodiment, the data line DL 0 is electrically connected to the even bit lines (bit 0, bit 2, bit 4, . . . , bit 14, . . . , bit 126) and the data line DL 8 is electrically connected to the odd bit lines (bit 1, bit 3, bit 5, . . . , bit 15, . . . , bit 127). The bit lines electrically connected to the load circuit for write I/O<0> and the bit lines electrically connected to the load circuit for write I/O<8> are alternatively arranged on the cell array 106 by alternatively connecting the respective two data lines to every other bit line.

Next, an operation of the semiconductor integrated circuit device according to one embodiment of the invention will be described.

(Normal Operation)

Normal operation (erase, write, and read) is the same as the operation of the typical 16 bits (one block/128 pages)/two-bank NOR-type flash memory. An explanation about the erase and read operation is omitted in this specification. Only the write operation will be described briefly.

Write data of 16 bits is input to the data input circuit portion 102 and each one bit enters each of the sixteen data input circuits. The write data of 16 bits input to the data input circuit portion 102 is transferred to the sense amplifier portion 103 belonging to the selected bank and each one bit is saved in each of the sixteen sense amplifiers. The load circuit portion for write 104 determines potential to be given to the data lines and bit lines according to the write data of 16 bits saved in the sense amplifier portion 103. According to the potential given to the bit line, data is written in a memory cell. The data written in the memory cell is defined as follows (in the case of binary memory).

Binary 1 (Data 1): state of delete (in which there are few electrons in a floating gate and the threshold is low)

Binary 0 (Data 0): state of write (in which there are a lot of electrons in a floating gate and the threshold is high)

When binary 0 is written into the memory cell, a high voltage for write is supplied from the load circuit for write to the data line. An example of the high voltage for write is 6V when the potential of a power source is 3V. A circuit example of the load circuit for write is, for example, shown in FIG. 4. When the high voltage for write is given to the data lines, the load transistors WP10, WP18, . . . , are turned on and the discharge transistors WR10, WR18, . . . , are turned off.

Next, the column select transistors connected to the unselected bit lines are turned off and the column select transistor connected to the selected bit line is turned on by using the column decoder 107. The high voltage for write given to the data line is given to the selected bit line through the column select transistor. The bit line is connected to the drain of the memory cell. The voltage of the drain of the memory cell rises to the same level as the high voltage for write or to the closer level.

Next, the row decoder 108 is used to set the control gates (word lines) of the unselected memory cells, for example, at a grounding potential Vss (for example, 0V) and the control gate (word line) of the selected memory cell at a higher potential than the grounding potential Vss. Because the voltage of the drain of the memory cell is the same as the high voltage for write or close to it, electrons flow from the source of the selected memory cell to the drain. Because a strong electric field is generated near the drain, electrons are accelerated near the drain, to become hot electrons. The hot electrons are pulled by the control gate potential of the selected memory cell and injected into the floating gate. As the result of the electron injection into the floating gate, the threshold of the memory cell rises and the data stored in the memory cell turns from the delete state (binary 1) to the write state (binary 0).

Writing of binary 0 is also called as write selected state.

When the binary 1 is written into the memory cell (when the delete state is maintained), the same potential as that of the source of the memory cell, for example, the grounding potential Vss is supplied from the load circuit for write to the data line. In this case, the load transistors WP10, WP 18, . . . , are turned off and the discharge transistors WR10, WR18, . . . , are turned on. The method for selecting a memory cell is as mentioned above. Because the potential of the drain of the memory cell is the same as that of the source, the electrons do not flow between the source and the drain of the selected memory cell. The electrons are not injected into the floating gate and the threshold of the memory cell remains in the delete state (binary 1).

Writing of binary 1 is called as write unselected state.

(Bit Line Stress Test Time)

In the basic pattern 4 of the cell array 106 according to one embodiment, as shown in FIG. 4, the cell array is formed in the range from one I/O=64 bits to two I/O=128 bits, each lower I/O is assigned to the even bits and each higher I/O is assigned to the odd bits in such a way that the lower/upper are alternatively assigned like I/O<0>, I/O<8>, I/O<0>, I/O<8>, I/O<0>, I/O<8>, . . . , assigned to bit 0, bit 1, bit 2, bit 3, bit 4, bit 5, and so on. In this way, the bit lines can be selected in a stripe shape.

The load circuit for write is arranged for every data line of each I/O and a state in which applied stress exists or not is realized by using it at the time of applying stress.

The bit line stress test is one of the experimental items conducted at the time of the die sort test. The bit line stress test is one of the screening tests for sorting possible chips of initial failure by supplying electric stress to the bit lines. There are three stress modes as follows.

(1) All Bit-Stress Test (2) Even Bit-Stress Test (3) Odd Bit-Stress Test

The operation at the time of each test will be descried.

Figure 5:
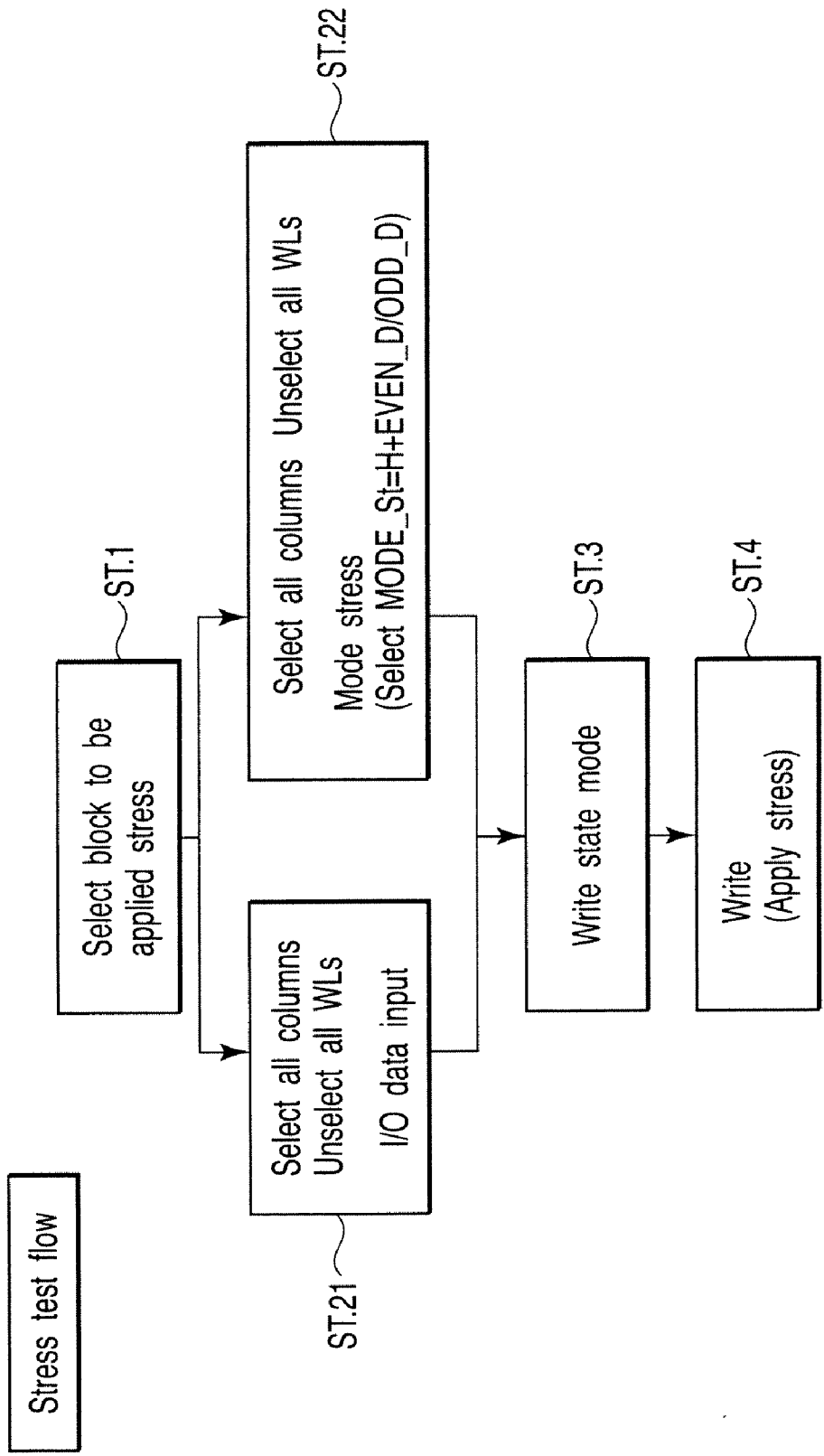
FIG. 5 is a flowchart showing a flow of the bit line stress test of the semiconductor integrated circuit device according to the embodiment of the invention.

FIG. 5 is a flowchart showing a flow of the bit line stress test of the semiconductor integrated circuit device according to the embodiment of the invention.

As shown in FIG. 5, at first, a block in which stress is applied is selected (ST. 1).

There are two methods for supplying stress to the bit lines. The first method is to input data from the input/output pad portion 101 to the data input circuit as shown in ST. 21. The second method is to generate data in the data input circuit portion 102 itself without inputting the data from the input/output pad portion 101.

(1) All Bit-Stress Test

When the first method is used for the all bit-stress test, binary 0 is input to all the data input circuits by giving binary 0 to all the input/output pads. Since the load transistors WP10, WP18, . . . , are turned on and the discharge transistors WR10, WR18, . . . , are turned off, the high voltage for write is given to all the data lines (DL 0 to 15). The column decoder 107 selects all the column select transistors and turns them on. The high voltage for write is applied to all the bit lines.

The bit line stress test is carried out in the write mode in the embodiment. All the bit lines within the cell array 106 are the same as a state of writing binary 0 (ST. 3). The row decoder 108 selects none of the memory cells and turns off all the memory cells. It is to prevent accidental data writing.

The potential of the bit lines remains in binary 0 writing state for a predetermined period of time. An electric stress is applied to the bit lines (ST. 4). In this way, the all bit-stress test is completed. After that, it is checked whether the semiconductor integrated circuit device is broken or not.

When the second method is used for the all bit-stress test, binary 0 has to be generated in all the data input circuits. There follow the same processes shown in ST. 3 and ST. 4.

(2) Even Bit-Stress Test

When the first method is used for the even bit-stress test, binary 0 is input to the lower data input circuits (I/O<0> to I/O<7>) and binary 1 is input to the upper data input circuits (I/O<8> to I/O<15>) by giving binary 0 to the lower input/output pads and binary 1 to the upper input/output pads. The high voltage for write is given only to the lower data lines (DL 0 to DL 7) and, for example, the grounding potential is given to the upper data lines (DL 8 to DL 15). All the column select transistors are turned on. The high voltage for write is given only to the lower bits (even bits). The upper bits (odd bits) are connected to the grounding potential Vss through the column select transistors and the discharge transistors WR18, . . . , connected to the upper data lines (DL 8 to DL 15). In this way, the condition in which the even bits are stressed is achieved. The processes of ST. 3 and ST. 4 are the same as those of the all bit-stress test.

When the second method is used for the even bit-stress test, binary 0 is generated in the upper data input circuits (I/O<0> to I/O<7>) and binary 1 is generated in the lower data input circuits (I/O<8> to I/O<15>). The processes of ST. 3 and ST. 4 are the same as those of the all bit-stress test.

(3) Odd Bit-Stress Test

When the first method is used for the odd bit-stress test, binary 1 is input to the lower data input circuits (I/O<0> to I/O<7>) and binary 0 is input to the upper data input circuits (I/O<8> to I/O<15>) by giving binary 1 to the lower input/output pads and binary 0 to the upper input/output pads. The input state of the data is inverse to that of the even bit-stress test. The high voltage for write is given only to the upper bits (odd bits) by turning on all the column select transistors. The lower bits (even bits) are connected to the grounding potential Vss through the column select transistors and the discharge transistors WR10, . . . , connected to the lower data lines (DL 0 to DL 8). In this way, the condition in which the odd bits are stressed is achieved. The processes of ST. 3 and ST. 4 are the same as those of the all bit-stress test.

When the second method is used for the odd bit-stress test, binary 1 is generated in the upper data input circuits (I/O<0> to I/O<7>) and binary 0 is generated in the lower data input circuits (I/O<8> to I/O<15>). The processes of ST. 3 and ST. 4 are the same as those of the all bit-stress test.

(Column Decoder)

Figure 6:
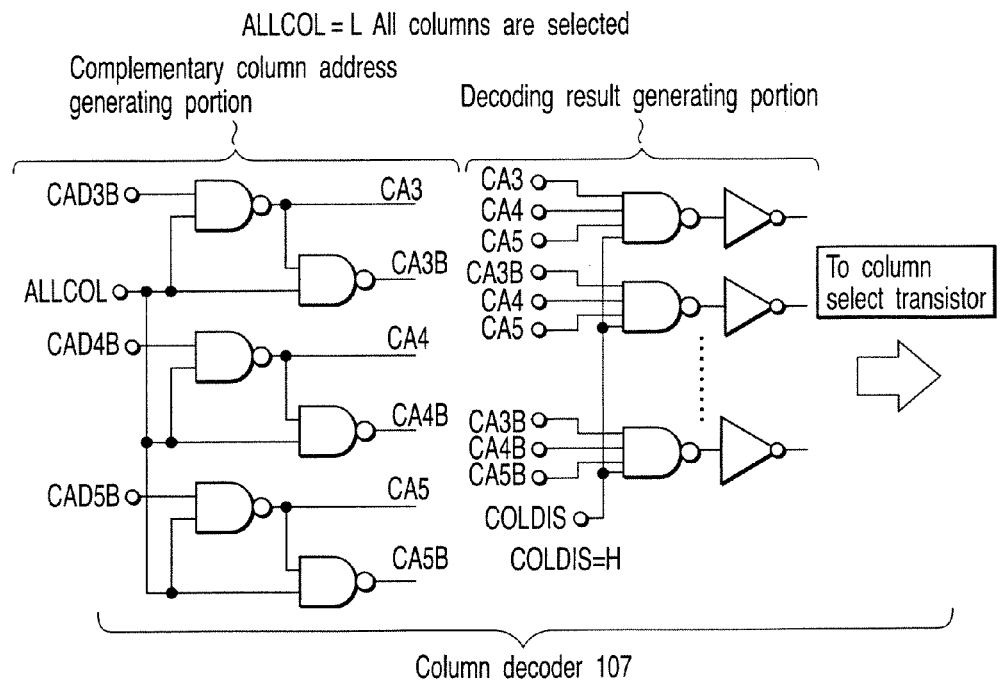
FIG. 6 is a circuitry showing a circuit example of a column decoder in which all columns are selected.

FIG. 6 is a circuitry showing a circuit example of a column decoder 107 in which all columns are selected.

FIG. 6 shows a circuit which decodes the lower 3 bits, CAD 3 to CAD 5, of all the 6 bits of the column address CADs, in the column decoder 107.

As shown in FIG. 6, the column decoder 107 includes a complementary column address generating portion which generates complementary column addresses CAn and CAnB (B shows the negative logic) from one column address CADnB (or CADn) and a decoding result generating portion which decodes the complementary column addresses CAn and CAnB to generate the decoded result of "n-th power of 2".

Paying attention to one column address CADnB, the complementary column address generating portion according to the embodiment generates the complementary column addresses CAn and CAnB by outputting the column address CADnB through a NAND gate circuit in the odd stage or in the even stage. The all-select signal ALLCOL is input to the second input of each NAND gate circuit.

When the all-select signal ALLCOL is high, each NAND gate circuit reverses and outputs the level of the signal input to the first input. As a result, one column address CADnB becomes the complementary column addresses CAn and CAnB which are respectively high and low.

In contrast, when the all-select signal ALLCOL is low, each NAND gate circuit outputs high regardless of the level of the signal input to the first input. As a result, the column addresses CAn and CAnB are not high and low, and both of them are high. In the drawing, all the eight column select signals are selected.

The decoding result generating portion includes an AND gate circuit which is provided according to all the combinations of the column addresses CAn and CAnB. For example, since a portion of the column decoder 107 shown in FIG. 6 decodes the column addresses CAD 3 to CAD 5 for 3 bits, there are eight combinations=the cube of 2. There are provided eight combinations of the AND gate circuits. Only when the input of one AND gate circuit is high, high is output to the column select transistor. At the normal operation, only one of eight AND gate circuits outputs is high.

When the all-select signal ALLCOL is low and the whole complementary column address generating portion outputs high over all, all the eight combinations of the AND gate circuits set in the decoding result generating portion output high. As mentioned above, the eight column select lines are all selected in the drawing.

The AND gate circuit of the embodiment is formed by connecting a NOT gate circuit (inverter) to the output of the NAND gate circuit. A column select line discharge signal COLDIS is input to the forth input of the NAND gate circuit.

When the discharge signal COLDIS is low, the decoding result generating portion outputs low and selects none of the column select lines regardless of the logic of the complementary column addresses CAn and CAnB input to the first to third inputs of the NAND gate circuit. At the time of the bit line stress test, the discharge signal COLDIS has to be high.

The discharge signal COLDIS which selects none of the column select lines does not seem to be concerned with the bit line stress test for selecting all the column select lines. However, the discharge signal COLDIS may be used as the signal that determines the start timing of the bit line stress test.

For example, assume that the all-select signal ALLCOL is low and that all the AND gate circuits of the decoding result generating portion are in a state to output high. Then, the discharge signal COLDIS is made low and the outputs of all the AND gate circuits of the decoding result generating portion are forcedly made low. At the time of starting the bit line stress test, all the AND gate circuits of the decoding result generating portion output high switched from low all at once by switching the discharge signal COLDIS from low to high.

In this way, when the start timing of the bit line stress test is determined by using the discharge signal COLDIS, the test can start without passing through the NAND gate circuits of the complementary column address generating portion. Thus, the test time can be shortened further than in the case in which the all-select signal ALLCOL is switched from low to high in order to determine the start timing. Since the number of stages of the gate circuits is the same, an error between the bits of the start timing is reduced.

The column decoder 107 shown in FIG. 6 can be used to set all the column select transistors in unselected state until the potential given to the data lines gets stable and to switch the column select transistors to the all selected state after the potential of the data lines gets stable.

According to these benefits, the column decoder 107 shown in FIG. 6 can more exactly control the time of applying the stress to the bit lines and the record of applying the stress advantageously. Since the bit line stress test is to supply the stress to the semiconductor integrated circuit device, unevenness in the time of applying the stress and the record of applying the potential makes it harder to obtain the correct result of selection. Further, the above may be a factor which damages the semiconductor integrated circuit device accidentally. The stress applying time to the bit lines and the potential applied record have to be more correct as long as the semiconductor integrated circuit device progresses toward miniaturization and high integration.

Since the stress applying time to the bit lines and the potential applied record require the alignment of the timing for selecting all the column select transistors and the stability of the potential of the data lines, the column decoder shown in FIG. 6 is advantageous to make the stress applying time to the bit lines and the potential applied record exactor.

(Row Decoder)

Figure 7:
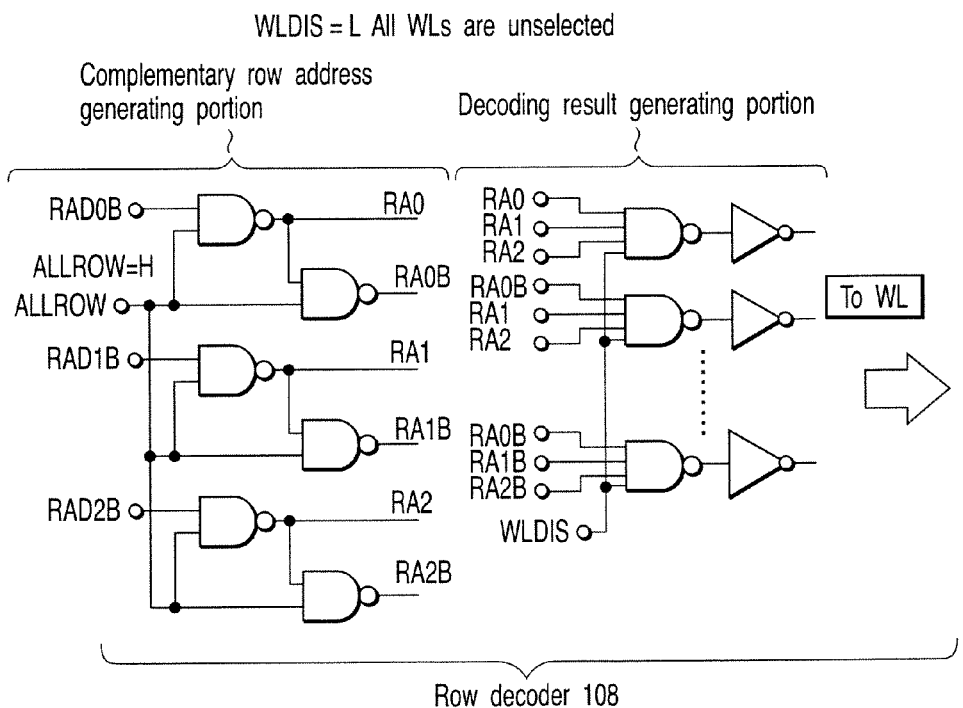
FIG. 7 is a circuitry showing a circuit example of a row decoder in all-unselected condition.

FIG. 7 is a circuitry showing a circuit example of the row decoder 108 which selects none of the cells.

As shown in FIG. 7, the circuit structure of the row decoder 108 which selects none of the cells is different from the circuit structure of the column decoder 107 shown in FIG. 7 only in a signal ALLROW and a signal WLDIS.

FIG. 7 shows the circuit which decodes the RAD 0 to RAD 2 for the upper 3 bits, of the row addresses RADs for 9 bits in total, in the row decoder 108.

In the row decoder 108 shown in FIG. 7, all the eights word lines are unselected in the drawing when the discharge signal WLDIS goes low.

The signal ALLROW corresponds to the signal ALLCOL shown in FIG. 6. When the signal ALLROW is high, the complementary row address generating portion generates the complementary row addresses RAn and RAnB from the row address RADnB (or RADn). In contrast, when the signal ALLROW is low, the complementary row address generating portion generates the row addresses RAn and RAnB at high regardless of the row address RADnB (or RADn). At the time of the bit line stress test, the signal ALLROW may not be used (Don't Care).

(Data Input Circuit)

Figures 8, 9, 10:
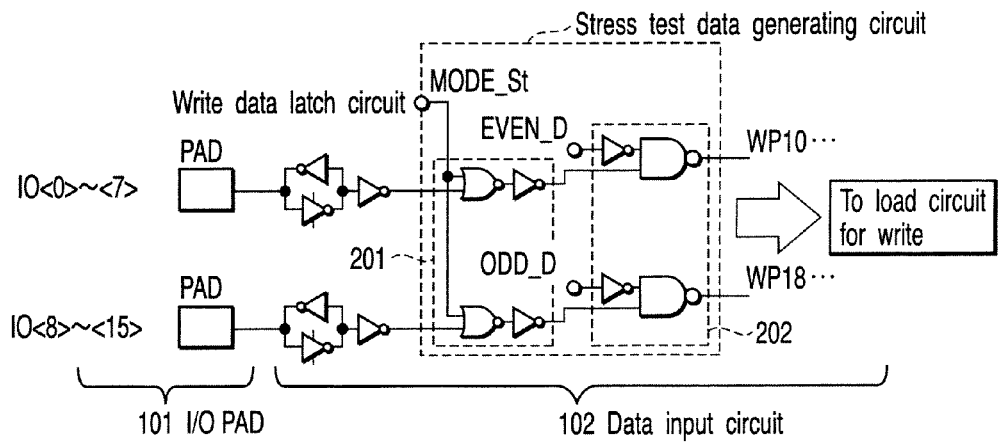
FIG. 8 is a circuitry showing a circuit example of a data input circuit in which test data may be generated.
FIG. 9 is a view showing a signal example in the case of I/O data input.
FIG. 10 is a view showing a signal example in the case of mode stress.

FIG. 8 is a circuitry showing a circuit example of the data input circuit portion 102 used for the second method.

As shown in FIG. 8, the data input circuit portion 102 includes write data latch circuits and a stress test data generating circuit. The write data latch circuit is a circuit for temporarily keeping the write data and it may be used as the sense amplifier.

The stress test data generating circuit is used at the time of the bit line stress test. The stress test data generating circuit according to the embodiment is interposed between the write data latch circuits and the load circuits for write in order to generate data regardless of the data temporarily kept in the write data latch circuits.

The stress test data generating circuit according to the embodiment includes an input invalid circuit 201 which blocks the outputs from the write data latch circuits and a test data generating circuit 202.

The input invalid circuit 201 according to the embodiment includes OR gate circuits in which the NOT gate circuits (inverters) are connected to the outputs of the NOR gate circuits. The outputs of the write data latch circuits are input to the first inputs of the NOR gate circuits and the mode stress signal MODE_St is input to the second inputs.

When the mode stress signal MODE_St is low, the input invalid circuit 201 changes the output logic according to the logic of the write data input to the first inputs. That is, the data input from the write data latch circuits is made effective and transmitted to the load circuits for write.

While, when the mode stress signal MODE_St is high, the input invalid circuit 201 makes the output logic high regardless of the logic of the write data input to the first inputs. That is, the data input from the write data latch circuits is made invalid.

The test data generating circuit 202 of the embodiment includes the NAND gate circuits. The outputs of the input invalid circuit 201 are input to the first inputs of the NAND gate circuits and even bit test data EVEN_D or odd bit test data ODD_D is input to the second inputs thereof.

The output logic of the NAND gate circuit follows the logic of the signal input to the second input when the output of the input invalid circuit 201 is high. When the mode stress signal MODE_St is high and the output of the input invalid circuit 201 is high, the data of the test data EVEN_D is supplied to the even bit lines through the data lines, and the data of the test data ODD_D is supplied to the odd bit lines through the data lines.

The embodiment shows such an example that the outputs of the test data generating circuit 202 are given to the gates of the load transistors WP10, WP18, . . . , of the load circuits for write. In order to supply binary 0 to the even bit lines, the logic of the test data EVEN_D is determined so that the test data generating circuit 202 may generate the potential to turn on the load transistor WP10. In the same way, the logic of the test data ODD_D is determined so that the test data generating circuit 202 may generate the potential to turn on the load transistor WP18 in order to supply binary 0 to the odd bit lines.

The data input circuit portion 102 shown in FIG. 8 may be also used for the I/O data input (ST. 21 shown in FIG. 5). The signal example of this case is shown in FIG. 9.

The signal example in the case of using the stress test data generating circuit (mode stress and ST. 22 shown in FIG. 5) is shown in FIG. 10.

(I/O Data Input)

As shown in FIG. 9, assume that the mode stress signal MODE_St is low, the test data EVEN_D=Low and the test data ODD_D=Low in the case of the I/O data input. In this state, binary 0 is input to the data input circuits I/O<0> to <15> at the time of the all bit-stress test, binary 0 is input to the data input circuits I/O<0> to <7> and binary 1 is input the data input circuits I/O<8> to <15> at the time of the even bit-stress test, and binary 1 is input to the data input circuits I/O<0> to <7> and binary 0 is input to the data input circuits I/O<8> to <15> at the time of the odd bit-stress test.

(Mode Stress)

As shown in FIG. 10, the data does not have to be input to the data input circuits (I/O<0> to I/O<15>) in the case of the mode stress. Alternatively, the mode stress signal MODE_St is made high. In this state, it should be as follows: the test data EVEN_D=High and the test data ODD_D=High at the time of the all bit-stress test, the test data EVEN_D=High and the test data ODD_D=Low at the time of the even bit-stress test, and the test data EVEN_D=Low and the test data ODD_D=High at the time of the odd bit-stress test.

According to the embodiment, for example, the cell array 106 is formed in the range from one I/O=64 bits to two I/O=128 bits, the lower I/O is assigned to each of the even bits and the upper I/O is assigned to each of the odd bits alternately in such a way that the I/O<0>, I/O<8>, I/O<0>, I/O<8>, I/O<0>, I/O<8>, . . . , are respectively assigned to the bit 0, bit 1, bit 2, bit 3, bit 4, bit 5, and so on. In this way, the bit lines may be selected in a stripe shape without a transistor for stress test which selects the bit lines in a stripe shape.

Figure 11:
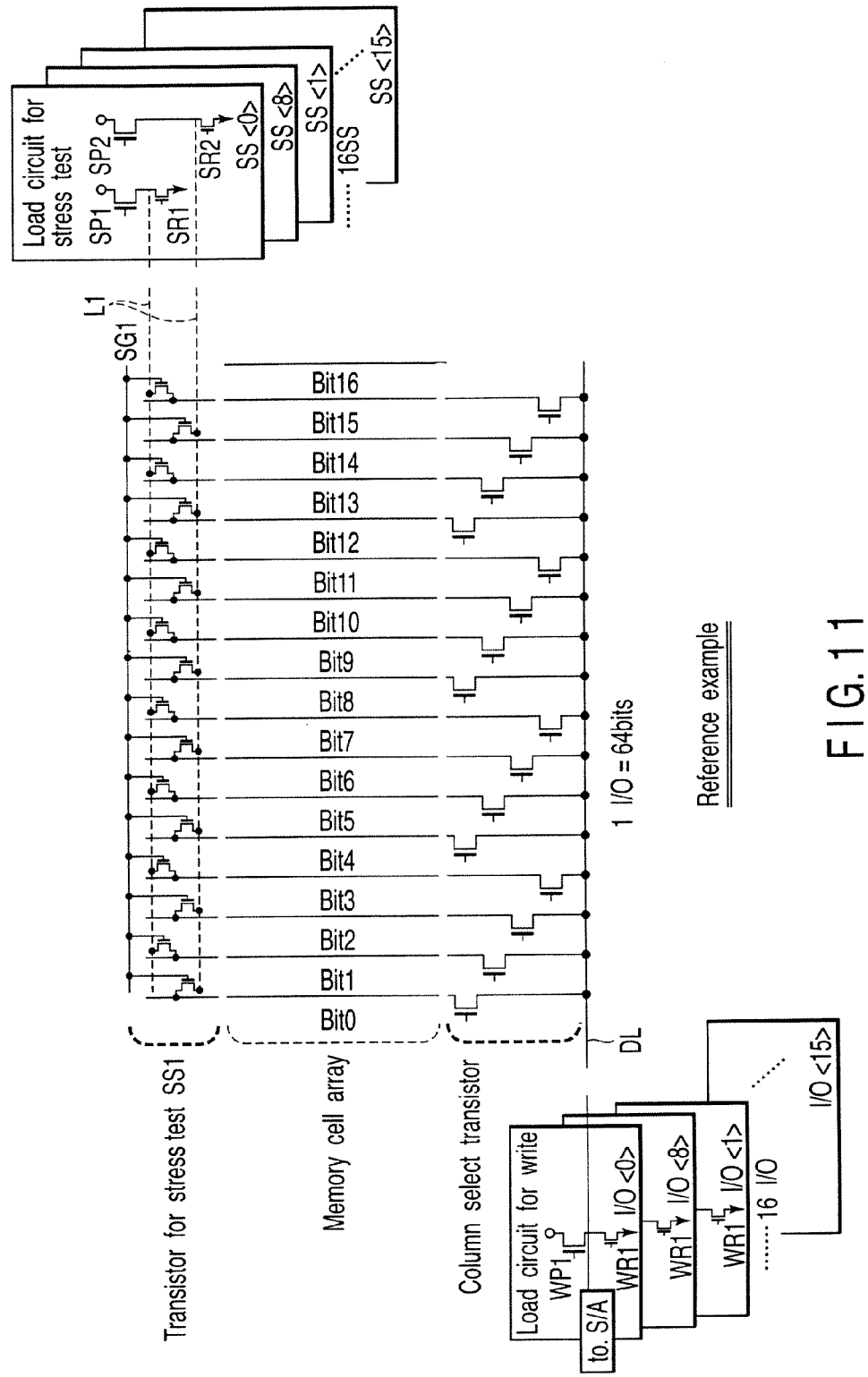
FIG. 11 is a circuitry showing an equivalent circuit of a basic pattern of the semiconductor integrated circuit device according to a reference example.
Figure 12:
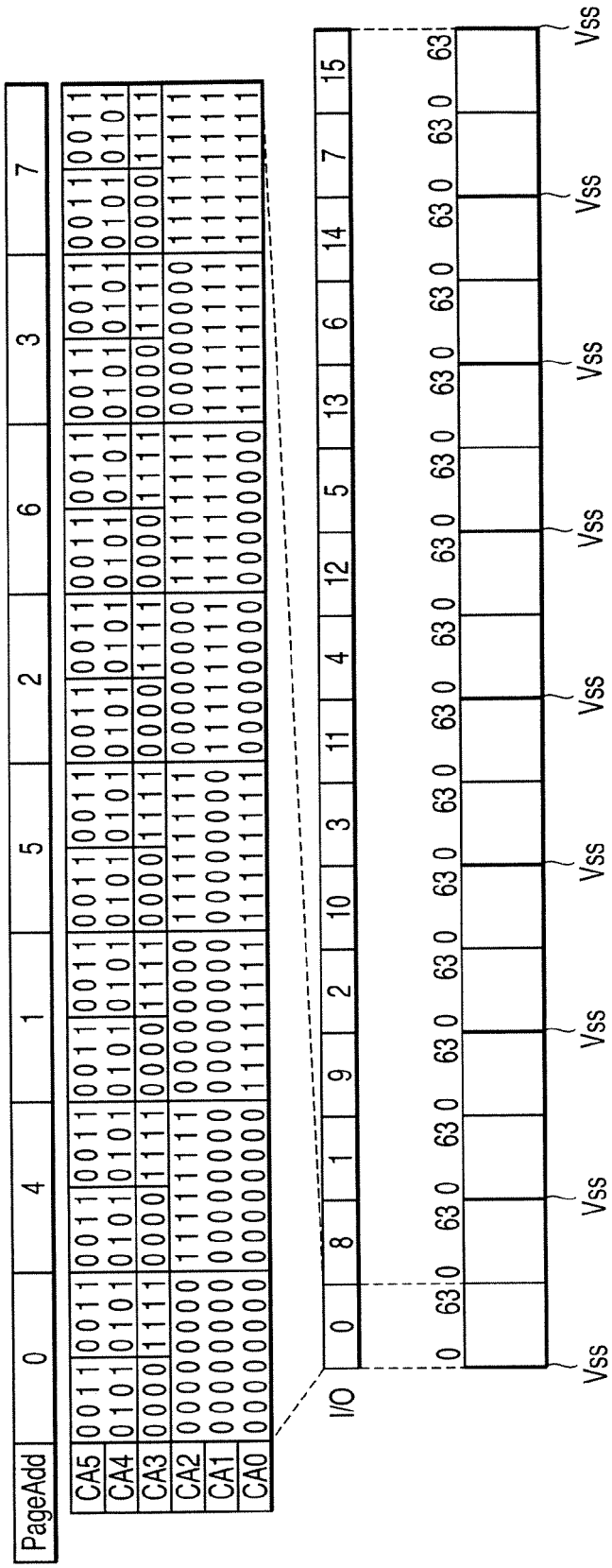
FIG. 12 is a view showing a relation between a column address and a position of a bit line and a global grounding line in the semiconductor integrated circuit device according to a reference example.

The circuit which gives the potential to the bit lines uses the load circuits for write connected to the data lines of each I/O. In this way, the stress may be supplied to the bit lines without the stress load circuit. The semiconductor integrated circuit device according to the reference example is shown in FIGS. 11 and 12. FIG. 11 is a circuitry of the portion corresponding to the basic pattern shown in FIG. 4.

As shown in FIG. 11, load circuits for stress test SS<0> to <15>, transistors for stress test SS1 and a wiring L1 for charge and discharge are set in the basic pattern in the reference example. Although it is not illustrated especially, a decode circuit which selects the transistor for stress test SS1 is also provided. These are circuits for exclusive use in the bit line stress test.

The basic pattern shown in FIG. 11 is repeated in the column direction as shown in FIG. 3 and it forms the basic element as shown in FIG. 2. Further, the basic element forms one bank through its repetition in the row direction as shown in FIG. 1. It is formed in the multi-bank structure by repeating the bank in the column direction.

A lot of basic patterns are included in the NOR-type flash memory of the multi-bank structure as shown in FIG. 1. It is possible to increase the chip area by providing, for each basic pattern, the load circuits for stress test SS<0> to <15>, the transistors for stress test SS1, the wiring L1 for charge and discharge, and the decoder which selects the transistor for stress test SS1. Even though the load circuits for stress test SS<0> to <15> may be shared in some blocks, the chip area tends to be large.

On the contrary, in the embodiment it is possible to delete the load circuits for stress test SS<0> to <15>, the transistors for stress test SS1, the wiring L1 for charge and discharge, and the decode circuit which selects the transistor for stress test SS1 from the basic pattern, as mentioned above.

According to the embodiment, since there is no dedicated circuit for the bit line stress test, the chip area can be reduced and it is effective to increase the memory capacity when the chip area is the same.

FIG. 12 is a view showing a relation between an assignment of each column address of the semiconductor integrated circuit device and a position of the bit lines and global grounding lines according to the reference example.

Figure 13:
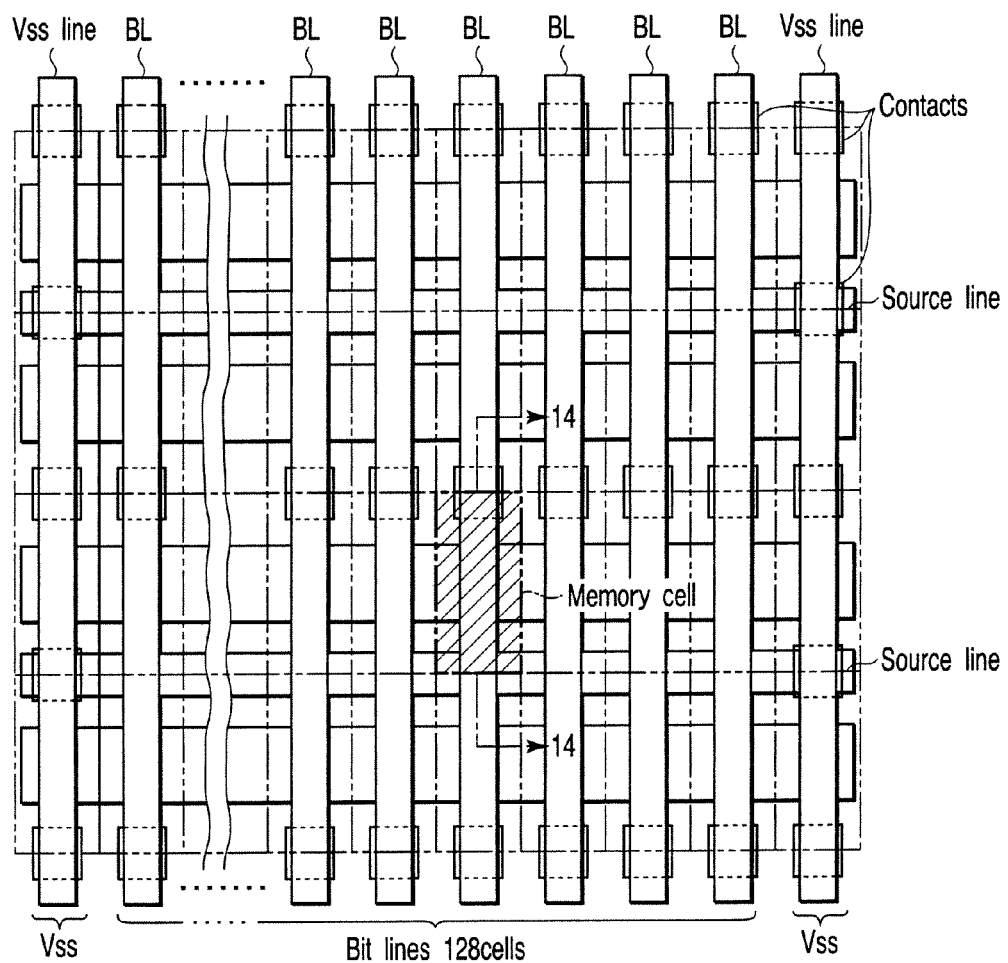
FIG. 13 is a plan view showing a plane pattern example of the semiconductor integrated circuit device having the global grounding lines.
Figure 14:
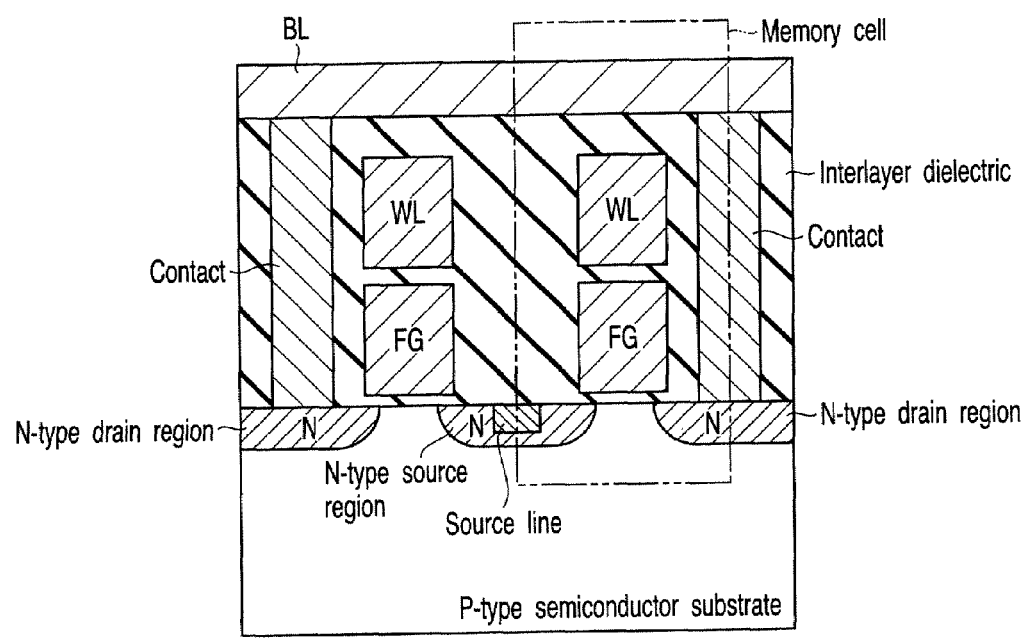
FIG. 14 is a cross-sectional view taken along the line 14-14 in FIG. 13.

As shown in FIG. 12, each one I/O for 64 bits is gathered together in the reference example. It is called as one I/O=64 bits. The global grounding line (Vss line) is arranged for every 128 bits. The global grounding line (Vss line) is the wiring which supplies the source potential to the source line within the cell and formed in parallel with the bit lines. A typical plane pattern example is shown in FIG. 13 and a cross-section example taken along the line 14-14 in FIG. 13 is shown in FIG. 14. As shown in FIG. 13, the global grounding line (Vss line) is connected to the source line through the contact. As shown in FIGS. 13 and 14, the source lines are arranged in parallel with the word lines and connected to N-type sources of the memory cells of the respective bits.

As shown in FIG. 11, since one I/O=64 bits is assigned to each bit line by turns, the bit lines selected are not adjacent to each other when the I/O 0 to I/O 15 are driven all at once. It is because only one of the 64 bit groups is driven. This is advantageous to distribute the cell current, flowing from the bit lines into the source lines through a channel of the memory cell, equally to the global grounding lines. When the selected bit lines are adjacent to each other, the cell current is not equally distributed to the global grounding lines, which causes unevenness, that is, some global grounding lines have a large amount of cell current and others have a small amount thereof. This causes a floating up of the potential of the source line. When the potential of the source line floats up, the memory cell to be turned on may be turned off and the wrong data may be read out at the time of reading data, while at the time of the data writing, the electric field between the source and the drain becomes small and the data is not written accurately.

In the embodiment, as for the two I/O=128 bits in which the one I/O is not sequentially assigned for 64 bits, one I/O=64 bits is alternatively assigned to every bit line (one I/O includes 64 bits, in the same way). This means that when the I/O 0 to the I/O 15 are driven all at once, there is a possibility that the selected bit lines are adjacent to each other.

In order to prevent it, the same addresses (block number) in the I/O 0 to I/O 15 are not adjacent to each other and assigned at a distance of 64 bits and more in the embodiment. A specific example is shown in FIG. 15.

Figure 15:
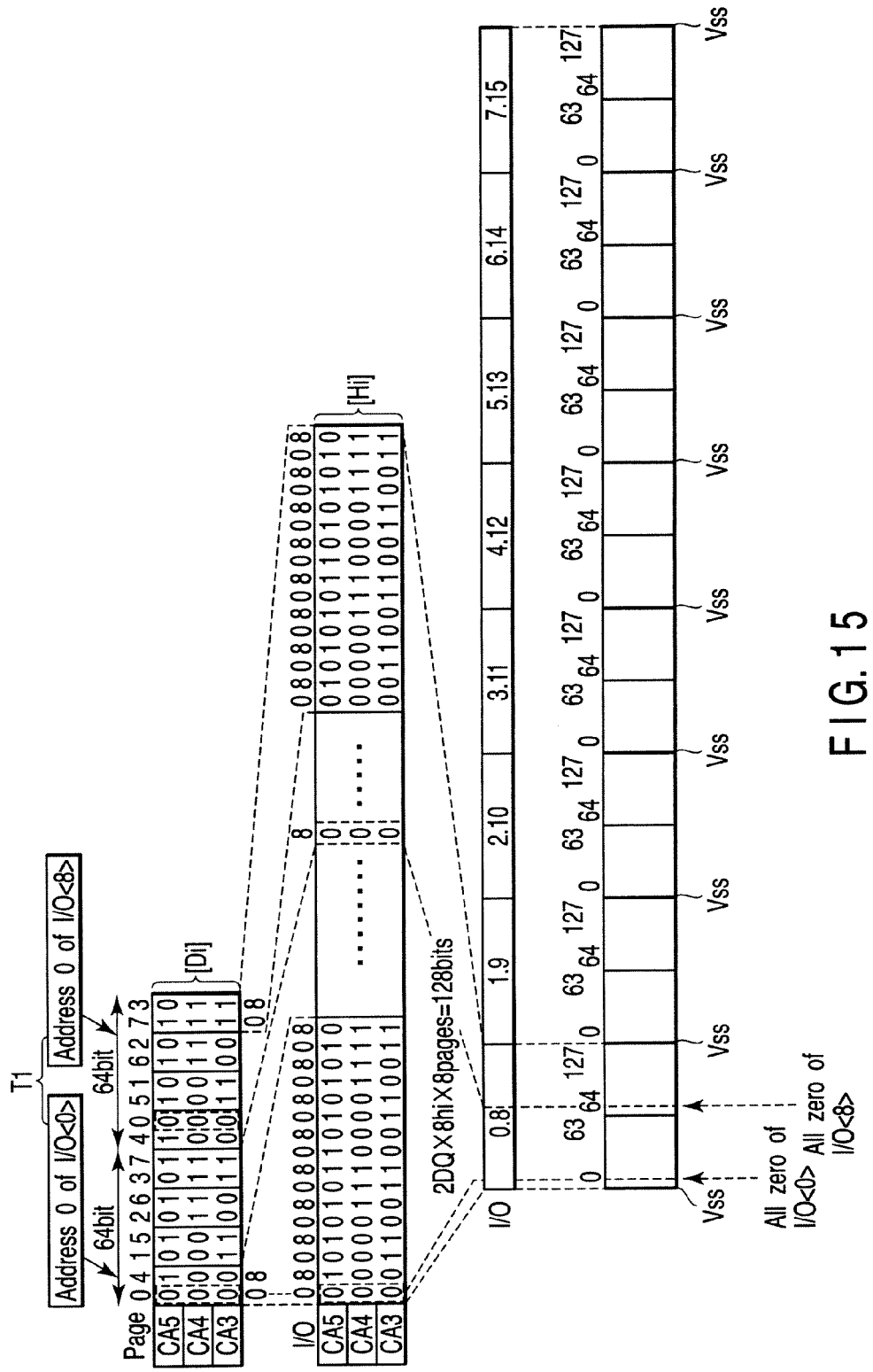
FIG. 15 is a view showing a relation between a column address and a position of a bit line and a global grounding line in the semiconductor integrated circuit device according to the embodiment of the invention.

As shown in FIG. 15, the all-zero address of the I/O<0> is assigned to the portion of the bit lines 0 to 63 and the all-zero address of the I/O<8> is assigned to the portion of the bit lines 64 to 127. In this way, since the same address of the I/O<0> and I/O<8> is assigned to the half region in the bit lines for the 128 bits between the global grounding lines, the cell current is equally distributed to the global grounding lines similarly to the case of the one I/O=64 bits.

According to the embodiment, the semiconductor integrated circuit device has the cell array in which two I/O=m bit is assigned alternately in every global grounding line. In the semiconductor integrated circuit device having such a cell array, the same address of the two I/O is respectively assigned to two regions around the m/2 bit. Therefore, it is possible to restrain the floating up of the potential of the source line and to reduce the possibility of misreading and miswriting, in the cell array of two I/O=m bit.

According to the embodiment, it is possible to provide the semiconductor integrated circuit device having the nonvolatile semiconductor memory which can carry out the bit line stress test even without a circuit for the bit line stress test.

As mentioned above, although the invention has been described according to the embodiment, the invention is not limited to the embodiment but various modifications can be made within the scope not departing from the spirit of the invention.

For example, as shown in FIG. 15, the data input circuits I/O<0> to I/O<15> are assigned to 1,024 bit lines for every 128 lines like (I/O<0>, I/O<8>), (I/O<1>, I/O<9>), (I/O<2>, I/O<10>), . . . , (I/O<7>, I/O<15>) in the embodiment, but they may be assigned arbitrarily. For example, the data input circuits I/O<0> to I/O<15> may be assigned to 1,024 bit lines for every 128 lines like (I/O<0>, I/O<1>), (I/O<2>, I/O<3>), (I/O<4>, I/O<5>), . . . , (I/O<14>, I/O<15>). The number of the bit lines and the number of the I/Os are not limited to 1,024 and sixteen respectively, but arbitrary.

The embodiment may include inventions in various stages and it is possible to abstract the inventions from various stages according to a proper combination of a plurality of components disclosed in the embodiment.

Although the embodiment has been described based on the example in which the invention is applied to the NOR-type flash memory, the invention is not limited to the NOR-type flash memory but it may be applied to an AND-type flash memory and a NAND-type flash memory other than the NOR-type flash memory. Further, the semiconductor integrated circuit device which contains such flash memories, including the processor, the system LSI and the like is in the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a memory cell array in which a plurality of memory cells are arranged in a matrix shape;
   a plurality of bit lines connected to the memory cells;

a plurality of column select transistors connected to the bit lines;

a column decoder which selects the column select transistor;

a first load circuit for write which is connected to even bit lines of the bit lines and supplies potential according to write data to the even bit lines at the time of writing data; and a second load circuit for write which is connected to odd bit lines in the bit lines and supplies potential according to write data to the odd bit lines at the time of writing data, wherein when a bit line stress test is carried out, in the case of an all bit-stress test, the column decoder selects all the column select transistors and supplies a high voltage for write from the first load circuit for write and the second load circuit for write to the even bit lines and the odd bit lines, in the case of an even bit-stress test, the column decoder selects all the column select transistors, supplies the high voltage for write from the first load circuit for write to the even bit lines, and supplies a lower potential than the above high voltage from the second load circuit for write to the odd bit lines, and in the case of an odd bit-stress test, the column decoder selects all the column select transistors, supplies the lower potential than the above high voltage from the first load circuit for write to the even bit lines, and supplies the high voltage for write from the second load circuit to the odd bit lines.

2. The device according to claim 1, wherein
the bit line-stress test is carried out in a write mode, and
a row decoder which selects a word line selects none of the word lines when the high voltage for write is applied to the bit lines.

3. The device according to claim 1, further comprising
a data input circuit, wherein
the first load circuit for write and the second load circuit for write determine whether the high voltage for write or the lower potential than the above high voltage is given to the even bit lines and the odd bit lines according to the data input to the data input circuit or the data generated by the data input circuit itself.

4. The device according to claim 2, further comprising
a data input circuit, wherein
the first load circuit for write and the second load circuit for write determine whether the high voltage for write or the lower potential than the above high voltage is given to the even bit lines and the odd bit lines according to the data input to the data input circuit or the data generated by the data input circuit itself.

5. The device according to claim 1, wherein
bit lines of n bit are respectively connected to the first I/O circuit and the second I/O circuit and the bit lines of n bit connected to the first I/O circuit and the bit lines of n bit connected to the second I/O circuit are aligned alternately, and among addresses of the bit lines of n bit connected to the first I/O circuit and addresses of the bit lines of n bit connected to the second I/O circuit, the same addresses are not adjacent to each other.

6. The device according to claim 2, wherein
bit lines of n bit are respectively connected to the first I/O circuit and the second I/O circuit and the bit lines of n bit connected to the first I/O circuit and the bit lines of n bit connected to the second I/O circuit are aligned alternately, and among addresses of the bit lines of n bit connected to the first I/O circuit and addresses of the bit lines of n bit connected to the second I/O circuit, the same addresses are not adjacent to each other.

7. The device according to claim 3, wherein
bit lines of n bit are respectively connected to the first I/O circuit and the second I/O circuit and the bit lines of n bit connected to the first I/O circuit and the bit lines of n bit connected to the second I/O circuit are aligned alternately, and among addresses of the bit lines of n bit connected to the first I/O circuit and addresses of the bit lines of n bit connected to the second I/O circuit, the same addresses are not adjacent to each other.

8. The device according to claim 4, wherein
bit lines of n bit are respectively connected to the first I/O circuit and the second I/O circuit respectively and the bit lines of n bit connected to the first I/O circuit and the bit lines of n bit connected to the second I/O circuit are aligned alternately, and among addresses of the bit lines of n bit connected to the first I/O circuit and addresses of the bit lines of n bit connected to the second I/O circuit, the same addresses are not adjacent to each other.

9. The device according to claim 5, wherein
the cell array has global source lines in parallel with the bit lines and the global source lines are aligned for every 2n bit.

10. The device according to claim 6, wherein
the cell array has global source lines in parallel with the bit lines and the global source lines are aligned for every 2n bit.

11. The device according to claim 7, wherein
the cell array has global source lines in parallel with the bit lines and the global source lines are aligned for every 2n bit.

12. The device according to claim 8, wherein
the cell array has global source lines in parallel with the bit lines and the global source lines are aligned for every 2n bit.

13. The device according to claim 2, wherein in the memory cell array, the even bit lines and the odd bit lines are alternately connected to the first load circuit for and the second load circuit for write.

14. The device according to claim 2, further comprising a data input circuit,
wherein the first and second load circuits for write determine whether or not to supply a high voltage to the even and odd bit lines, in accordance with data input to the data input circuit.

15. The device according to claim 2, further comprising a data input circuit, and an external pad connected to the data input circuit,
wherein the data input circuit designates whether or not to supply a high voltage from the external pad to the first and second load circuits for write or the data input circuit latches data supplied from the external pad when a command is input, and designates whether or not to supply a high voltage from the data input circuit to the first and second load circuits for write without using the external pad, when the bit line-stress test is carried out.

* * * * *